United States Patent
Hu et al.

(10) Patent No.: US 9,693,448 B2
(45) Date of Patent: Jun. 27, 2017

(54) FLEXIBLE CIRCUIT BOARD AND METHOD FOR MAKING THE SAME

(71) Applicants: FuKui Precision Component (Shenzhen) Co., Ltd., Shenzhen (CN); HongQiSheng Precision Electronics (QinHuangDao) Co., Ltd., Qinhuangdao (CN); Zhen Ding Technology Co., Ltd., Tayuan, Taoyuan (TW)

(72) Inventors: Xian-Qin Hu, Shenzhen (CN); Ming-Jaan Ho, New Taipei (TW)

(73) Assignees: FuKui Precision Component (Shenzhen) Co., Ltd., Shenzhen (CN); HongQiSheng Precision Electronics (QinHuangDao) Co., Ltd., Qinhuangdao (CN); GARUDA TECHNOLOGY CO., LTD., Taipei (TW)

(*) Notice: Subject to any disclaimer, the term of this patent is extended or adjusted under 35 U.S.C. 154(b) by 7 days.

(21) Appl. No.: 14/926,195

(22) Filed: Oct. 29, 2015

(65) Prior Publication Data
US 2017/0105280 A1    Apr. 13, 2017

(30) Foreign Application Priority Data
Oct. 8, 2015   (CN) .......................... 2015 1 0643564

(51) Int. Cl.
*H05K 1/00* (2006.01)
*H05K 1/02* (2006.01)
(Continued)

(52) U.S. Cl.
CPC ......... *H05K 1/0219* (2013.01); *H05K 1/0296* (2013.01); *H05K 3/022* (2013.01);
(Continued)

(58) Field of Classification Search
CPC .................... H05K 2201/0715; H05K 1/0219
See application file for complete search history.

(56) References Cited

U.S. PATENT DOCUMENTS

4,668,332 A * 5/1987 Ohnuki ................ H05K 1/0219
174/251
7,067,912 B2 * 6/2006 Takeuchi .......... H01L 23/49827
174/255
(Continued)

*Primary Examiner* — Hung V Ngo
(74) *Attorney, Agent, or Firm* — Steven Reiss (57) ABSTRACT

A flexible circuit board includes a wiring layer, two photosensitive resin layers, and two electromagnetic interference shielding layers. The wiring layer includes at least one signal line, two ground lines and at least two gaps. Each gap includes two opening portions. The two photosensitive resin layers cover the signal line and the opening portions, and are connected to each end of each ground line. Each electromagnetic interference shielding layer covers one photosensitive resin layer away from the signal line, portions of the two ground lines not connected to the photosensitive resin layer, and portions of the gaps not covered by the two photosensitive resin layers, thereby causing the portions of each gap not covered by the two photosensitive resin layers to define a receiving chamber. Each end of each receiving chamber communicates with one opening portion of the corresponding gap to define a cavity.

4 Claims, 12 Drawing Sheets

(51) Int. Cl.
*H05K 3/06* (2006.01)
*H05K 3/02* (2006.01)

(52) U.S. Cl.
CPC ........... *H05K 3/06* (2013.01); *H05K 2201/05* (2013.01); *H05K 2201/0715* (2013.01)

(56) References Cited

U.S. PATENT DOCUMENTS

| | | | | |
|---|---|---|---|---|
| 8,759,687 | B2* | 6/2014 | Naganuma | H05K 3/4691 |
| | | | | 174/255 |
| 9,072,177 | B2* | 6/2015 | Kido | C08L 63/00 |
| 2011/0067904 | A1* | 3/2011 | Aoyama | H05K 3/4069 |
| | | | | 174/254 |
| 2012/0187581 | A1* | 7/2012 | Shimada | H05K 1/0218 |
| | | | | 257/784 |

* cited by examiner

FLEXIBLE CIRCUIT BOARD AND METHOD FOR MAKING THE SAME

FIELD

The subject matter herein generally relates to a flexible circuit board and a method for making the flexible circuit board.

BACKGROUND

A circuit board may include a wiring layer, two dielectric layers respectively covering two surfaces of the wiring layer, and two electromagnetic interference shielding layers respectively covering the two dielectric layers. The dielectric layers are usually made of polyimide, liquid crystal polymer, or TEFLON, to reduce a signal attenuation generated in the circuit board.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Figure 1:
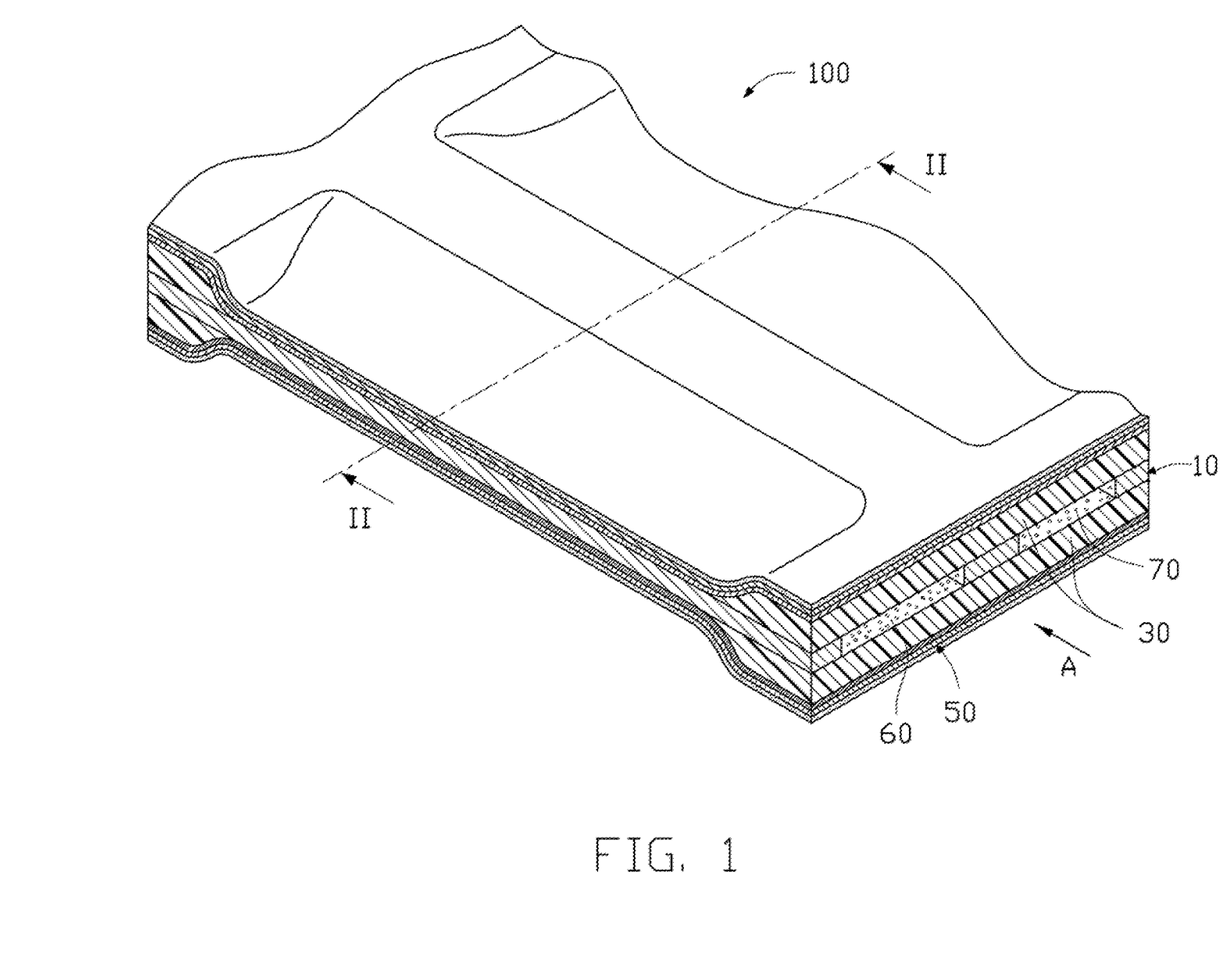
FIG. 1 is an isometric, cross-sectional view of an embodiment of a flexible circuit board.

FIG. 1 illustrates an embodiment of a flexible circuit board 100. The flexible circuit board 100 comprises a wiring layer 10, two photosensitive resin layers 30 formed on two opposite surfaces of the wiring layer 10, respectively, and two electromagnetic interference shielding layers 50 adhering to the two opposite surfaces of the wiring layer 10, respectively, covering the two photosensitive resin layers 30.

Figure 2:
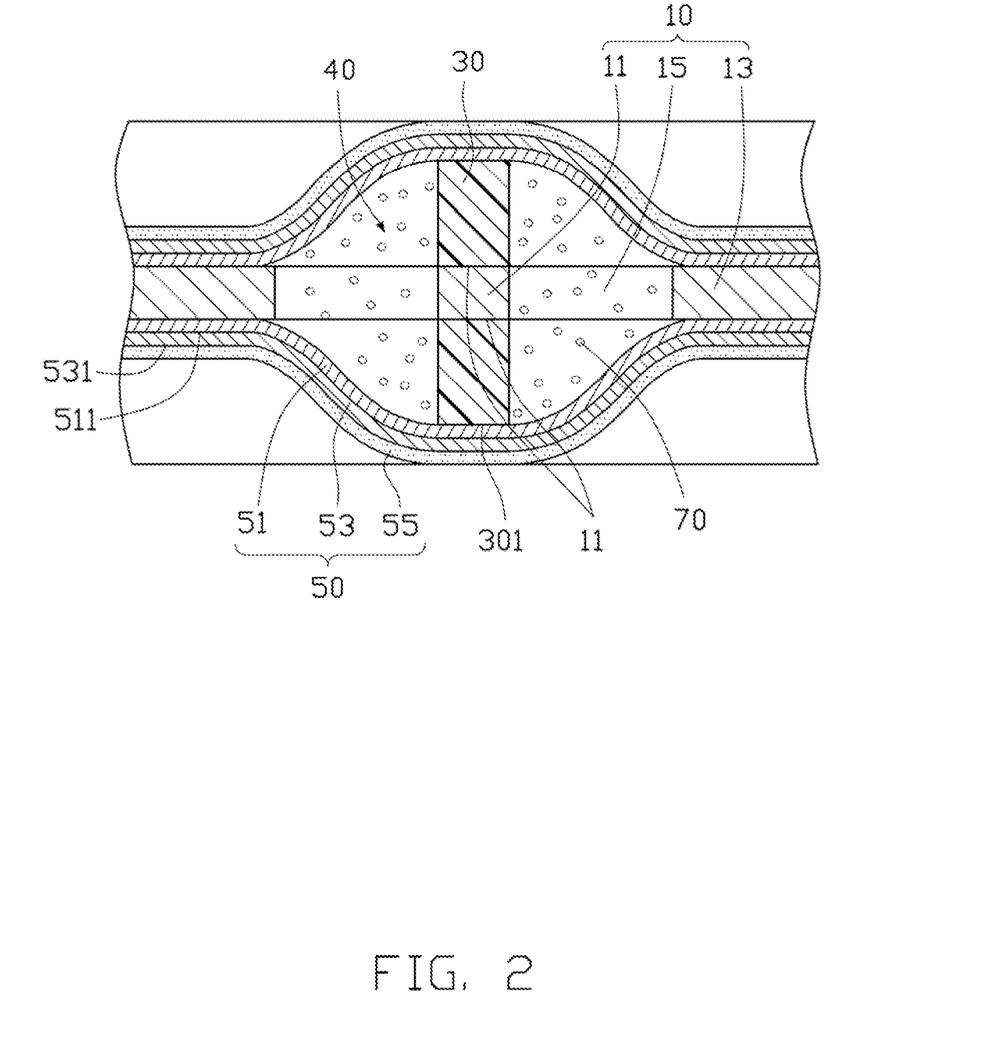
FIG. 2 is a cross-sectional view taken along line II-II of FIG. 1.

FIG. 2 illustrates that the wiring layer 10 comprises at least one signal line 11, two ground lines 13 positioned at two sides of the signal line 11, and at least two gaps 15. The gaps 15 separate the signal line 11 and the ground lines 13 from each other. In at least one embodiment, the wiring layer 10 comprises only one signal line 11, two ground lines 13 and two gaps 15. Each gap 15 is disposed between the signal line 11 and one ground line 13 to separate the signal line 11 and the ground line 13. The wiring layer 10 has a thickness of about 18 µm to about 70 µm. The thickness of the wiring layer 10 can vary according to need.

Figure 3:
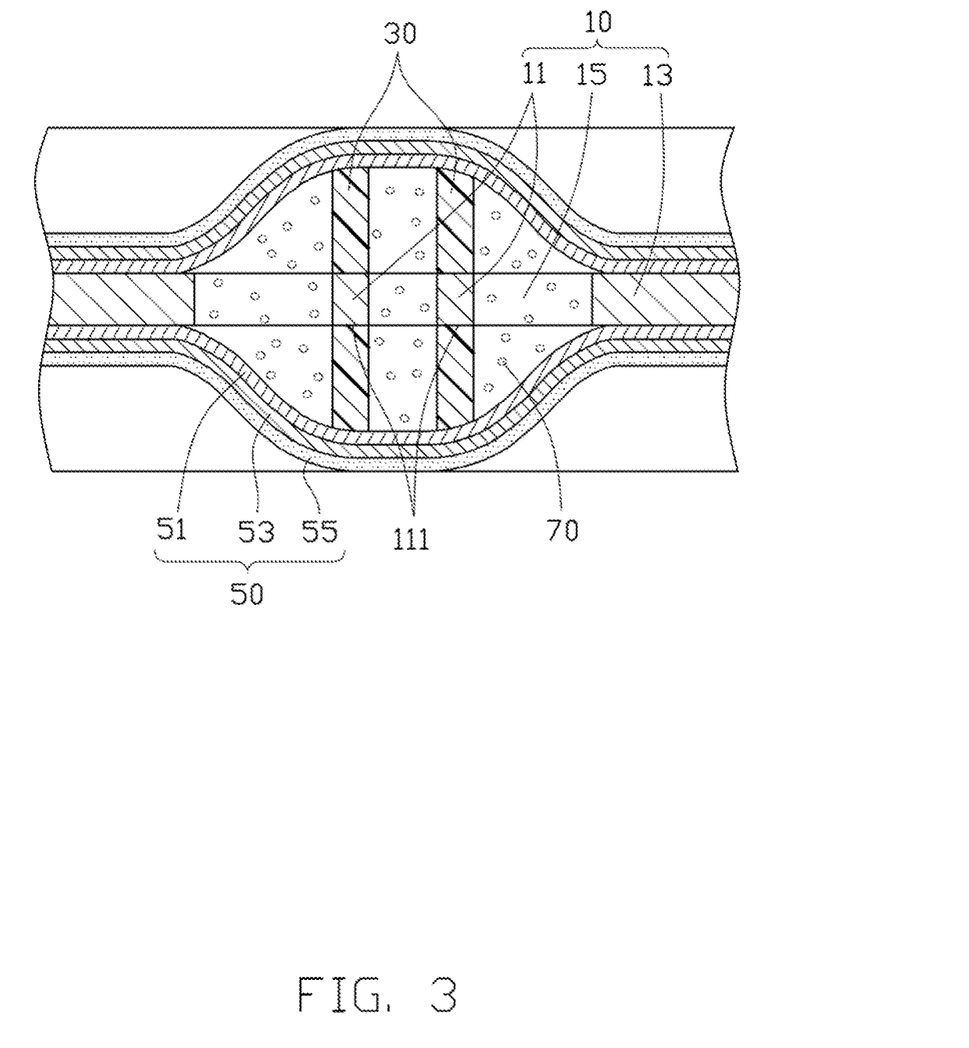
FIG. 3 is similar to FIG. 2, but showing the flexible circuit board of another embodiment.
Figure 4:
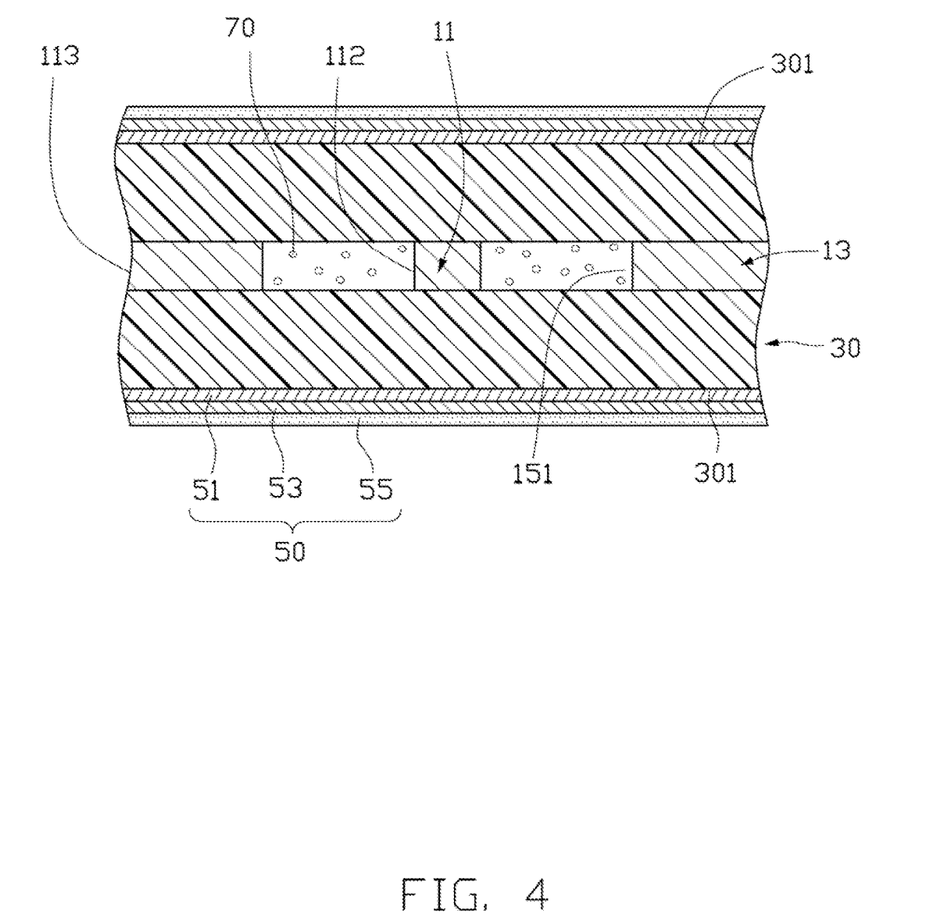
FIG. 4 is similar to FIG. 1, but viewed from direction A of FIG. 1.

FIG. 3 illustrates that in another embodiment, the wiring layer 10 comprises two parallel signal lines 11, two ground lines 13, and three gaps 15. The two signal lines 11 are located between the two ground lines 13. One gap 15 is disposed between the two signal lines 11. Each of the other two gaps 15 is disposed between one signal line 11 and the adjacent ground line 13. Each gap 15 comprises two opening portions 151 (shown in FIG. 4) located at positions corresponding to two ends 112 (shown in FIG. 4) of the adjacent signal line 11, respectively.

The two photosensitive resin layers 30 cover two opposite surfaces 111 of the signal line 11 (shown in FIG. 2), respectively, and cover the opening portions 151 of the gaps 15, and connect with each end 131 (shown in FIG. 4) of each ground line 13 (shown in FIG. 4) to provide support for each ground line 13. In at least one embodiment, the two photosensitive resin layers 30 cover the entire end 131 of each ground line 13 to achieve a good bond strength. Each photosensitive resin layer 30 has a thickness of about 80 µm to about 200 µm. The thickness of the photosensitive resin layer 30 may vary according to need. In another embodiment, the two photosensitive resin layers 30 may cover a portion of the end 131 of each ground line 13.

The two electromagnetic interference shielding layers 50 respectively cover two surfaces 301 of the two photosensitive resin layers 30 away from the signal line 11, portions of the two ground lines 13 not connected to the photosensitive resin layer 30, and portions of the gaps 15 not covered by the two photosensitive resin layers 30. Under the support of the two photosensitive resin layers 30, the two electromagnetic interference shielding layers 50, the two photosensitive resin layers 30, the signal line 11, and the ground lines 13 surround the portions of each gap 15 not covered by the two photosensitive resin layers 30 to cooperatively define a receiving chamber 40 (shown in FIG. 2). In at least one embodiment, each receiving chamber 40 has a volume larger than the corresponding gap 15. Two ends of each receiving chamber 40 are in air communication with the two opening portions 15 of the corresponding gap 15, respectively, to define a cavity 60 (shown in FIG. 1). Each electromagnetic interference shielding layer 50 between two ends 131 of each ground line 13 has an undulated surface (not shown) which inclining from the photosensitive resin layer 30 to each ground line 13. Each electromagnetic interference shielding layer 50 comprises an anisotropic conductive resin layer 51, a metal layer 53, and a protective layer 55. Two anisotropic conductive resin layers 51 are connected to two photosensitive resin layers 30 and the ground lines 13, respectively. The metal layer 53 is formed on a surface 511 of the anisotropic conductive resin layers 51 away from the wiring layer 10. The protective layer 55 is formed on a surface 531 of the metal layer 53 away from the anisotropic conductive resin layer 51.

Air 70 (shown in FIG. 1) is received in the cavity 60, and functions as a dielectric layer of the flexible circuit board 100 which surrounds the signal line 11. A dielectric constant of the air 70 is about 1.0 F/m which is less than a dielectric constant of polyimide, liquid crystal polymer, or TEFLON. Thus, when a signal is transmitted through the signal line 11, a signal attenuation generated in the dielectric layer made of air 70 is less than a signal attenuation generated in a dielectric layer made of polyimide, liquid crystal polymer, or TEFLON. In addition, the two photosensitive resin layers 30 cover the opening portions 151 and are connected to each end 131 of each ground line 13 (shown in FIG. 4), thereby ensuring a stability of the cavity 60. The two photosensitive resin layers 30 only cover the two opposite surfaces 111 of the signal line 11 (shown in FIG. 2) and the opening portions 151, thereby causing the flexible circuit board 100 to be arched. The air 70 received in the cavity 60 as a dielectric layer can further improve a flexibility of the flexible circuit board 100, and support two undulated surfaces to prevent from contacting with each other. The anisotropic conductive resin layer 51 has a thickness of about 5 μm to about 20 μm. In one embodiment, the metal layer 53 is made of copper foil. The metal layer 53 has a thickness of about 5 μm to about 9 μm. The protective layer 55 is made of an insulating material such as ink. The protective layer 55 has a thickness of about 7.5 μm to about 18 μm. In other embodiments, the metal layer 53 may be made of silver foil. The thicknesses of the anisotropic conductive resin layer 51, the metal layer 53, and/or the protective layer 55 can vary according to need.

The flexible circuit board 100 can further comprises terminals (not shown) formed at two ends of the flexible circuit board 100. The flexible circuit board 100 is electrically connected to other electronic elements (such as keyboard, not shown) via the terminals.

Figure 5:
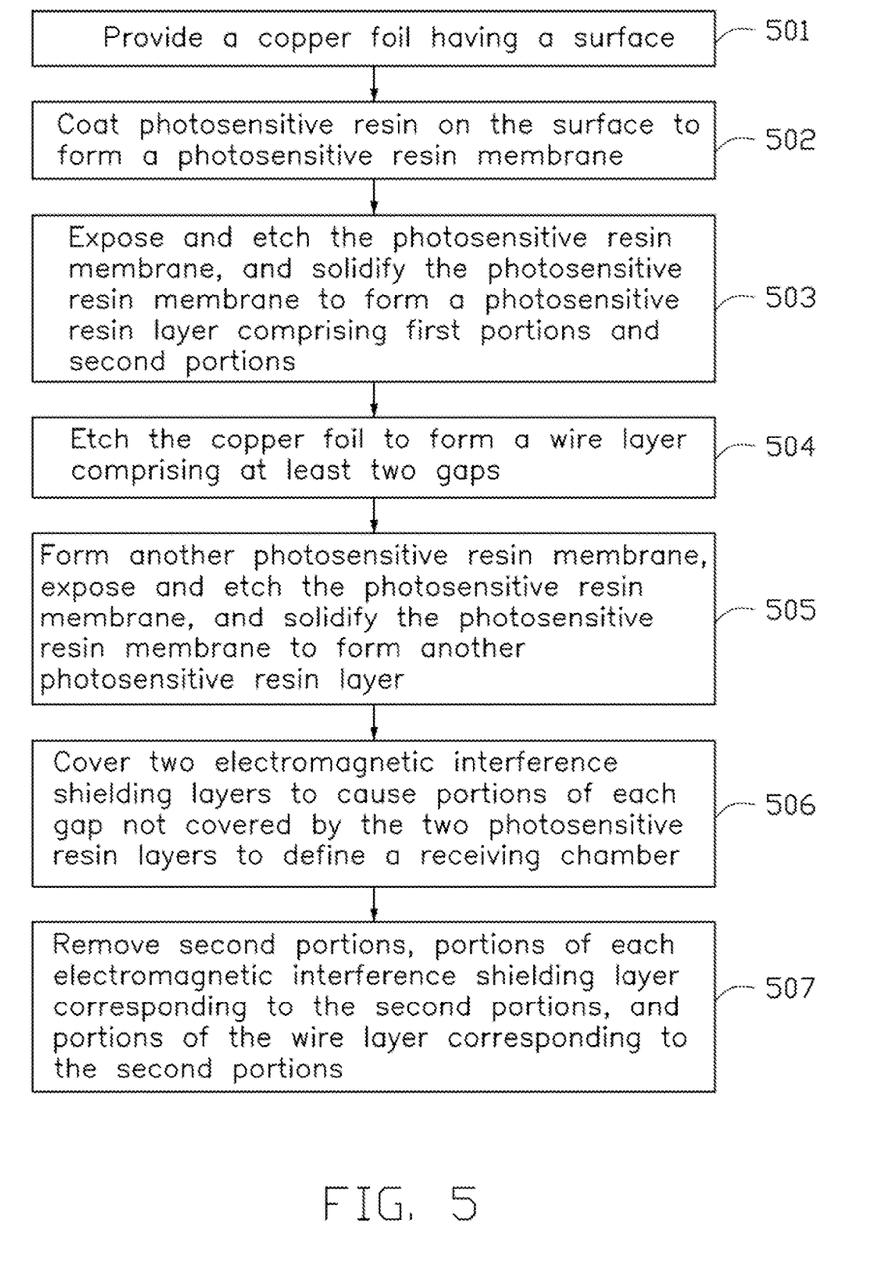
FIG. 5 is a flowchart of an embodiment of a method for making a flexible circuit board.

Referring to FIG. 5, a flowchart is presented in accordance with an exemplary embodiment. The exemplary method for making the flexible circuit board 100 is provided by way of example, as there are a variety of ways to carry out the method. The method described below can be carried out using the configurations illustrated in FIGS. 1-4, for example, and various elements of these figures are referenced in explaining the example method. Each block shown in FIG. 5 represents one or more processes, methods or subroutines, carried out in the exemplary method. Furthermore, the illustrated order of blocks is by example only and the order of the blocks can change. Additional blocks may be added or fewer blocks may be utilized, without departing from this disclosure. The exemplary method can begin at block 501.

At block 501, a copper foil 1 (shown in FIG. 6) is provided.

Figure 6:
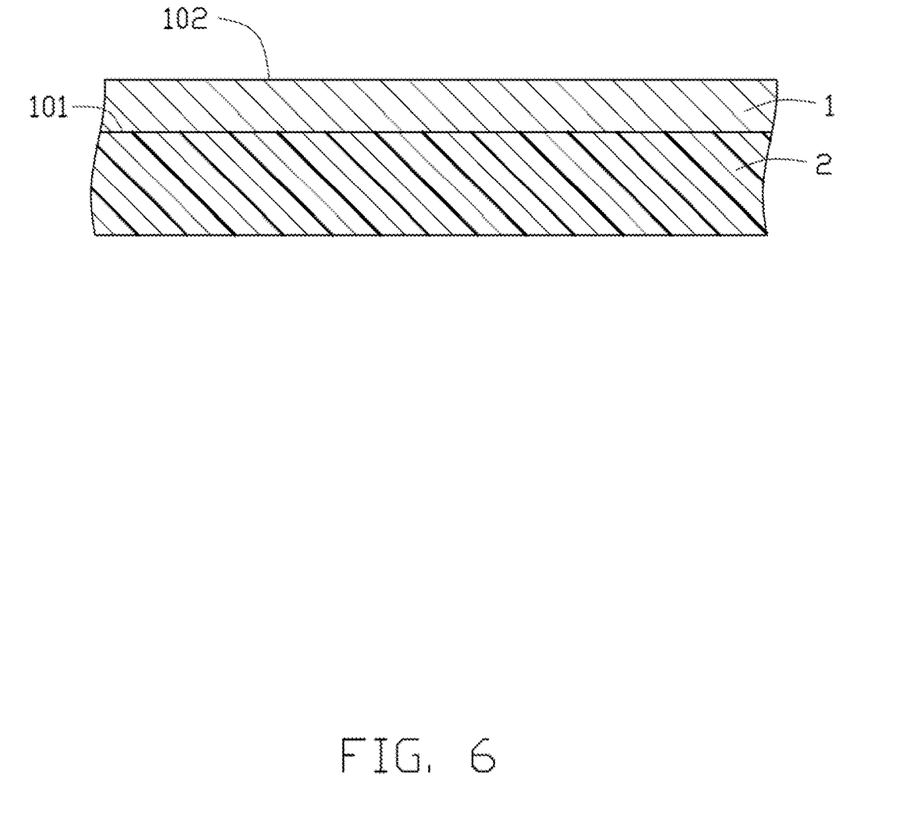
FIG. 6 is a cross-sectional view showing a copper foil being connected to a photosensitive resin membrane.

At block 502, photosensitive resin is coated on a surface 101 of the copper foil 1 to form a photosensitive resin membrane 2 (shown in FIG. 6). The photosensitive resin membrane 2 is semi-solidified.

Figure 7:
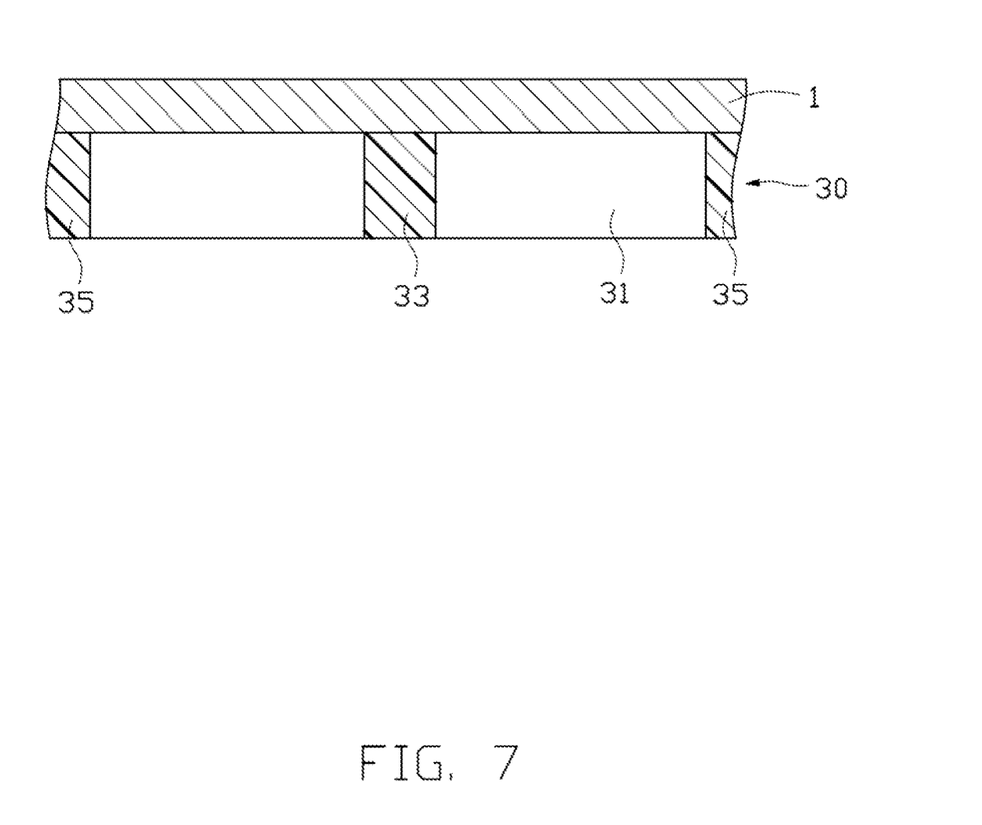
FIG. 7 is a cross-sectional view showing the photosensitive resin membrane of FIG. 6 being exposed to form a photosensitive resin layer.

At block 503, the photosensitive resin membrane 2 is exposed and etched to form at least two parallel grooves 31 (shown in FIG. 7) exposing the copper foil 1, and then is solidified to form a photosensitive resin layer 30 (shown in FIG. 7). The photosensitive resin layer 30 comprises a first portion 33 (shown in FIG. 7) formed between each two grooves 31, and a second portion 35 (shown in FIG. 7) positioned at a side of each outermost groove 31 away from the first portion 33. In at least one embodiment, the photosensitive resin layer 30 comprises only two grooves 31.

Figure 8:
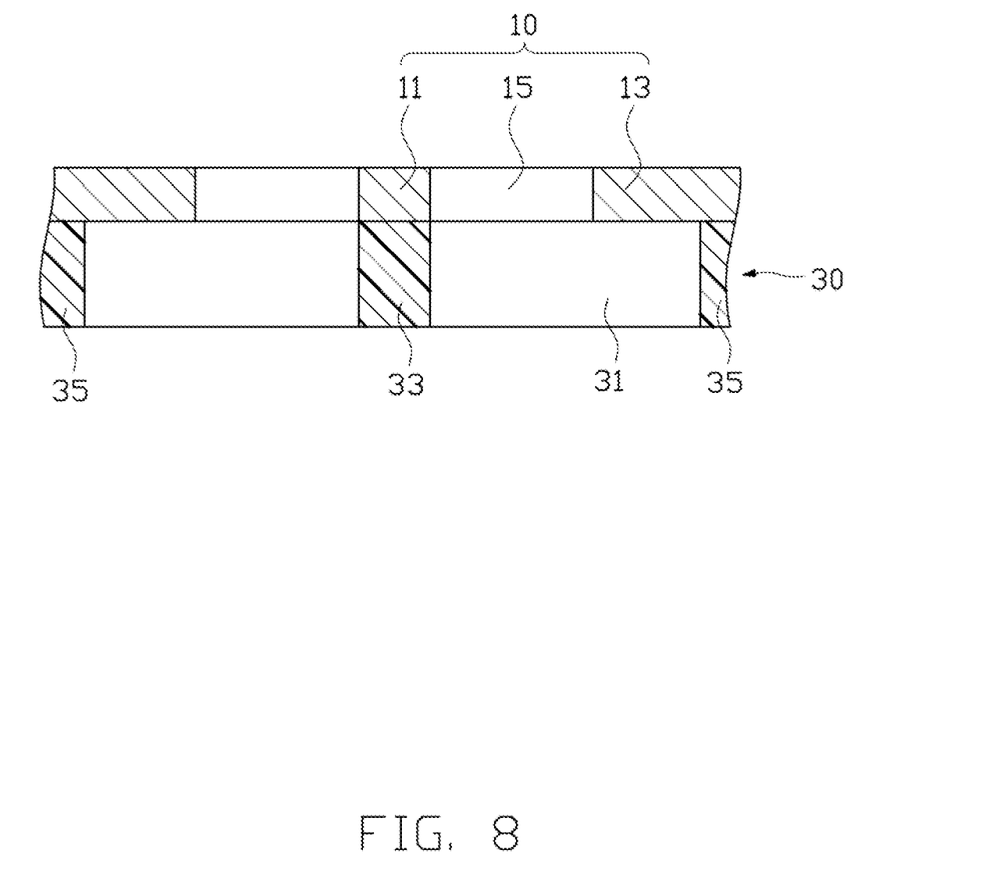
FIG. 8 is a cross-sectional view showing the copper foil of FIG. 7 being etched to form a wiring layer.
Figure 9:
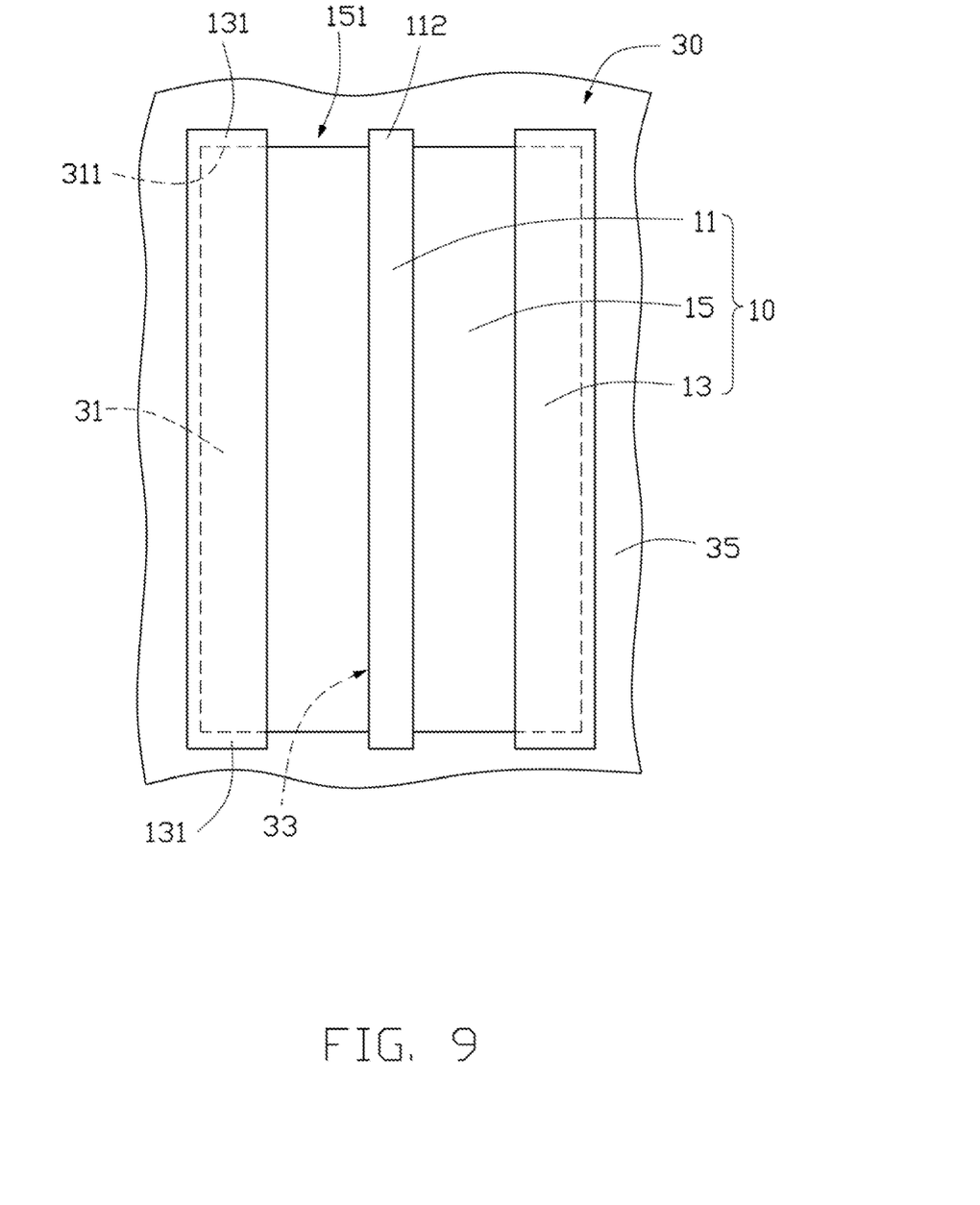
FIG. 9 is similar to FIG. 8, but showing the wiring layer from another angle.

At block 504, the copper foil 1 is etched to form a wiring layer 10 (shown in FIG. 8). The wiring layer 10 comprises at least one signal line 11 (shown in FIG. 8), two ground lines 13 (shown in FIG. 8) positioned at two sides of the signal line 11, and at least two gaps 15 (shown in FIG. 8). Each signal line 11 extends along the groove 31, and is positioned corresponding to one first portion 33. The two ground lines 13 are parallel to the signal line 11, and are disposed corresponding to two outermost grooves 31, respectively. At least two ends 131 (shown in FIG. 9) of each ground line 13 are connected to two ends 311 (shown in FIG. 9) of the corresponding groove 31, respectively, to cause the ground line 13 to be supported by the photosensitive resin layer 30. The gaps 15 are capable of separating the signal line 11 and the ground lines 13 from each other. Each gap 15 is positioned corresponding to one groove 31, and comprises two opening portions 151 (shown in FIG. 9) corresponding to two ends 112 (shown in FIG. 9) of the signal line 11, respectively.

Figure 10:
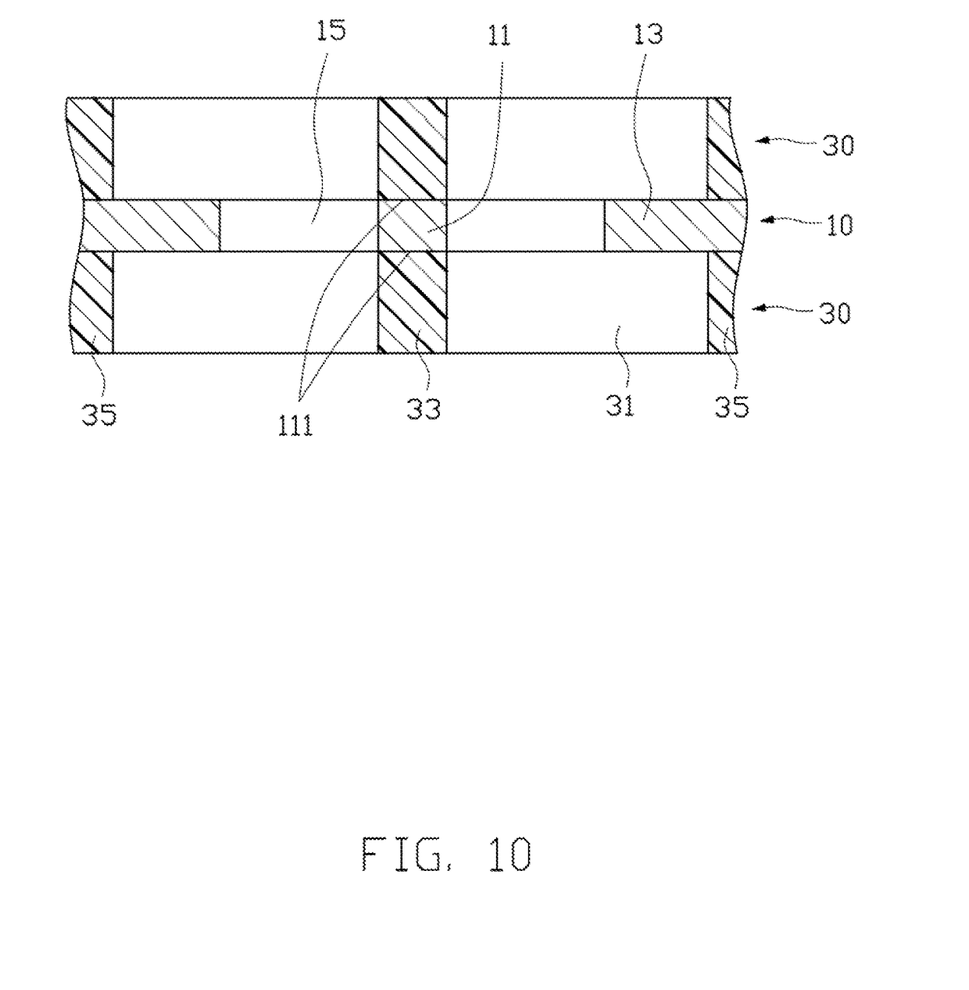
FIG. 10 is a cross-sectional view showing another photosensitive resin layer being formed on a surface of the wiring layer of FIG. 8 away from the photosensitive resin layer.
Figure 11:
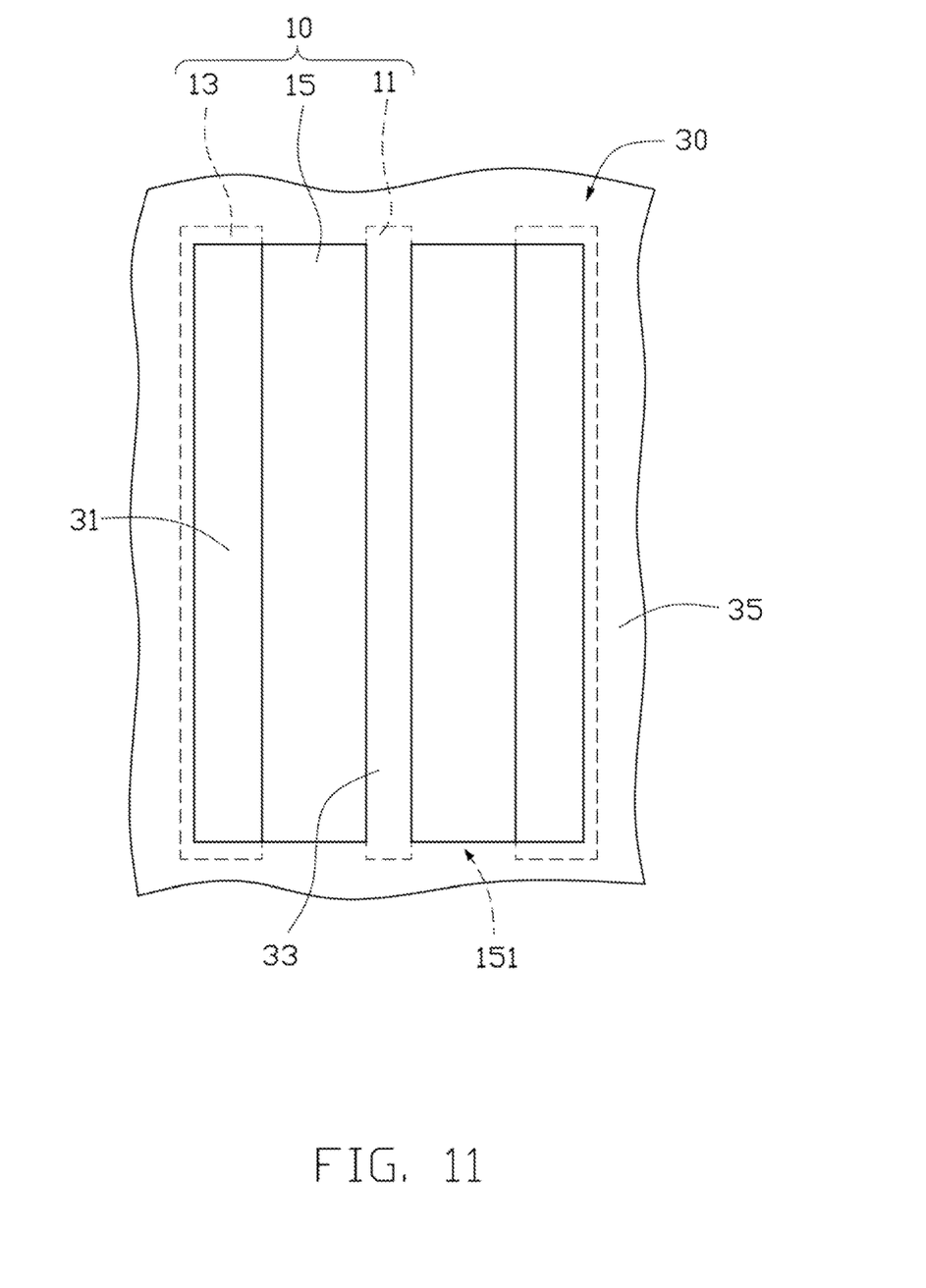
FIG. 11 is a similar to FIG. 10, but showing the photosensitive resin layer from another angle.

At block 505, photosensitive resin is coated on a surface 102 of the wiring layer 10 away from the photosensitive resin layer 30 to form another photosensitive resin membrane 2 (shown in FIG. 10). The photosensitive resin membrane 2 is exposed and etched to form at least two parallel grooves 31 corresponding to the photosensitive resin layer 30, and is solidified to form another photosensitive resin layer 30. The two photosensitive resin layers 30 cover two opposite surfaces 111 of the signal line 11, respectively, and cover the opening portions 151 (shown in FIG. 11), and connect with each end 131 of each ground line 13, respectively.

At block 506, two electromagnetic interference shielding layers 50 (shown in FIG. 12) are provided which cover the first portion 33, portions of the two ground lines 13 not connected to the photosensitive resin layer 30, and portions of the gaps 15 not covered by the two photosensitive resin layers 30. The two electromagnetic interference shielding layers 50 are pressed, to cause the two electromagnetic interference shielding layers 50 to connected to the portions of the two ground lines 13 not connected to the photosensitive resin layer 30, thereby forming a middle body 200 (shown in FIG. 12). The two electromagnetic interference shielding layers 50, the two photosensitive resin layers 30, the signal line 11, and the ground lines 13 surround the portions of each gap 15 not covered by the two photosensitive resin layers 30 to cooperatively define a receiving chamber 40 (shown in FIG. 12). Two ends of each receiving chamber 40 respectively communicate with the two opening portions 15 of the corresponding gap 15 to define a cavity 60 (shown in FIG. 1).

Figure 12:
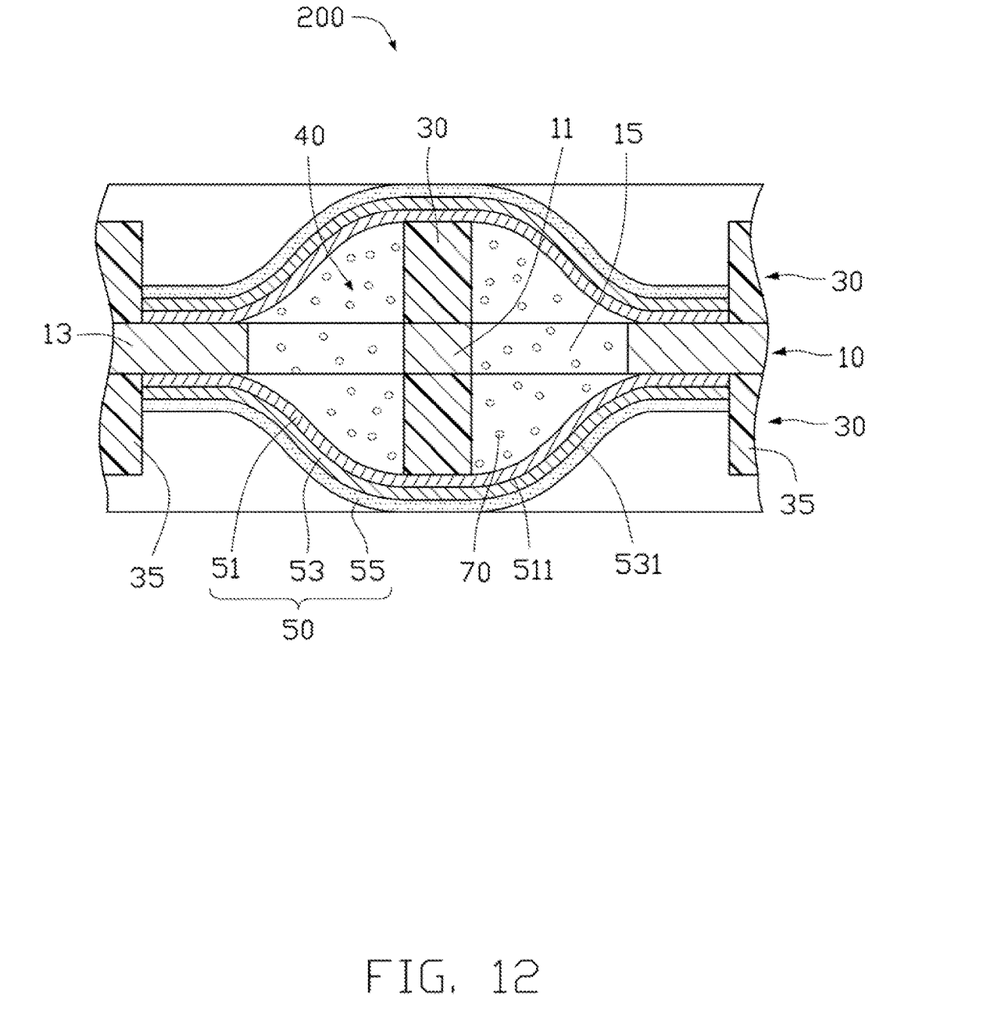
FIG. 12 is a cross-sectional view showing two electromagnetic interference shielding layers covering the two photosensitive resin layers and the wiring layer of FIG. 10.

In at least one embodiment, each electromagnetic interference shielding layer 50 comprises an anisotropic conductive resin layer 51 (shown in FIG. 12), a metal layer 53 (shown in FIG. 12), and a protective layer 55 (shown in FIG. 12). Two anisotropic conductive resin layers 51 are connected to two photosensitive resin layers 30 and the ground lines 13, respectively. The metal layer 53 is formed on a surface 511 (shown in FIG. 12) of the anisotropic conductive resin layers 51 away from the wiring layer 10. The protective layer 55 is formed on a surface 531 (shown in FIG. 12) of the metal layer 53 away from the anisotropic conductive resin layers 51.

At block 507, the second portions 35, portions of each electromagnetic interference shielding layer 50 corresponding to the second portions 35, and portions of the wiring layer 10 corresponding to the second portions 35 of the middle body 200 are removed to form the flexible circuit board 100 (shown in FIG. 2). In at least one embodiment, the second portions 35, portions of each electromagnetic interference shielding layer 50 corresponding to the second portions 35, and portions of the wiring layer 10 corresponding to the second portions 35 are removed by punching.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A flexible circuit board comprising:
   a wiring layer comprising at least one signal line, two ground lines positioned at two sides of the at least one signal line, and at least two gaps for separating the at least one signal line and the ground lines from each other, each gap comprising two opening portions each located at positions corresponding to one end of the adjacent signal line;
   two photosensitive resin layers; and
   two electromagnetic interference shielding layers;
   wherein the two photosensitive resin layers cover two opposite surfaces of the at least one signal line and the opening portions, and are connected to each end of each ground line, each electromagnetic interference shielding layer covers a surface of one photosensitive resin layer away from the signal line, portions of the two ground lines not connected to the photosensitive resin layer, and portions of the gaps not covered by the two photosensitive resin layers, thereby causing the two electromagnetic interference shielding layers, the two photosensitive resin layers, the signal line, and the ground lines to surround the portions of each gap not covered by the two photosensitive resin layers and cooperatively define a receiving chamber, each end of each receiving chamber is in air communication with one opening portion of the corresponding gap to define a cavity with air.

2. The flexible circuit board of the claim 1, wherein the two photosensitive resin layers 30 cover an entire end of each ground line.

3. The flexible circuit board of the claim 1, wherein the two photosensitive resin layers cover a portion of the end of each ground line.

4. The flexible circuit board of the claim 1, wherein each electromagnetic interference shielding layer comprises an anisotropic conductive resin layer, a metal layer, and a protective layer; each anisotropic conductive resin layer is connected to one of the two photosensitive resin layers and the two ground lines; the metal layer is formed on a surface of the anisotropic conductive resin layers away from the wiring layer, the protective layer is formed on a surface of the metal layer away from the anisotropic conductive resin layers.

* * * * *